United States Patent
Suplinskas et al.

(10) Patent No.: US 7,294,606 B2
(45) Date of Patent: Nov. 13, 2007

(54) SUBSTRATE AND METHOD FOR THE FORMATION OF CONTINUOUS MAGNESIUM DIBORIDE AND DOPED MAGNESIUM DIBORIDE WIRE

(75) Inventors: Raymond J. Suplinskas, Haverhill, MA (US); Douglas Finnemore, Ames, IA (US); Serquei Bud'ko, Ames, IA (US); Paul Canfield, Ames, IA (US)

(73) Assignees: Specialty Materials, Inc., Lowell, MA (US); Iowa State University Research Foundation, Inc., Ames, IA (US)

( * ) Notice: Subject to any disclaimer, the term of this patent is extended or adjusted under 35 U.S.C. 154(b) by 224 days.

(21) Appl. No.: 10/989,803

(22) Filed: Nov. 17, 2004

(65) Prior Publication Data

US 2005/0127353 A1 Jun. 16, 2005

Related U.S. Application Data

(62) Division of application No. PCT/US03/20628, filed on Jul. 1, 2003.

(60) Provisional application No. 60/429,137, filed on Nov. 26, 2002.

(51) Int. Cl.
*C01B 35/04* (2006.01)
*B32B 5/22* (2006.01)
*B32B 5/24* (2006.01)
*B32B 5/00* (2006.01)
*B05D 7/00* (2006.01)

(52) U.S. Cl. .................. 505/100; 423/289; 427/215; 427/445; 428/403; 505/473

(58) Field of Classification Search ................ 423/289; 505/110, 473, 100; 428/403; 427/215, 445
See application file for complete search history.

(56) References Cited

U.S. PATENT DOCUMENTS

| 6,511,943 B1* | 1/2003 | Serquis et al. ............. 505/300 |
| 6,586,370 B1* | 7/2003 | Holcomb ................... 505/236 |
| 6,630,427 B2* | 10/2003 | Dunand ..................... 505/452 |
| 7,090,889 B2* | 8/2006 | Liu et al. ...................... 427/62 |

OTHER PUBLICATIONS

E. Kuzmann et al, "Local environments of iron and cobalt in doped $MgB_2$ superconductors", Superconductor Science and Technology 15 (11), 1479-85 (2002), no month.*
D.A. Cardwell et al "Magnetic properties and crirical currents of bulk $MgB_2$ polycrystalline superconductor", Physica C: Superconductivity, vols. 372-376, Part 2, Aug. 2002, 1262-1265.*
Y. Feng et al, "Enhanced flux pinning in Zr-doped $MgB_2$ bulk superconductors prepared at ambient pressure", Journal of Applied Physics, Sep. 1, 2002, vol. 92 Issue 5, 2614-2619.*
Toulemonde et al "High-pressure synthesis of pure and doped superconducting $MgB_2$ compounds", Department de Physique de la Matiere Condensee, Universite de Geneve, BOROMAG, Genova, Italy, Jun. 17-19, 2002.*
S. Slusky et al, Loss of superconductivity with the addition of Al to $MgB_2$ and a structural transition in $Mg_{1-x} Al_x-B_2$, Nature, vol. 410 (Mar. 15, 2001), 343-345.*

* cited by examiner

*Primary Examiner*—Wayne A. Langel
(74) *Attorney, Agent, or Firm*—Mills & Onello LLP

(57) ABSTRACT

A chemically doped boron coating is applied by chemical vapor deposition to a silicon carbide fiber and the coated fiber then is exposed to magnesium vapor to convert the doped boron to doped magnesium diboride and a resultant superconductor.

10 Claims, No Drawings

SUBSTRATE AND METHOD FOR THE FORMATION OF CONTINUOUS MAGNESIUM DIBORIDE AND DOPED MAGNESIUM DIBORIDE WIRE

RELATED APPLICATION

This application is a Divisional Application under 37 CFR 1.53(b) of pending prior International Application No. PCT/US03/20628 filed on Jul. 1, 2003 and claims the benefit of U.S. Provisional Patent Application Ser. No. 60/429,137 filed on Nov. 26, 2002.

STATEMENT REGARDING FEDERALLY SPONSORED RESEARCH AND DEVELOPMENT

This invention was made in part with U.S. Government support under Grant Number W-7405-Eng-82 awarded by the Department of Energy. The U.S. Government may have certain rights in this invention.

BACKGROUND OF THE INVENTION

It has been discovered that magnesium diboride is a superconductor with a transition temperature of approximately 40 K. Magnesium diboride can be made by the reaction of elemental magnesium and boron. The result of this process is a fine powder which is commercially available. Experiments on small crystals of this material have demonstrated high current-carrying capabilities at high magnetic fields, properties which could make MgB2 very useful in applications such as magnetic resonance imaging (MRI) where large powerful magnets are required. Magnesium diboride, however is an intractable material with respect to the usual drawing processes for forming the continuous wires required for such applications.

Magnesium diboride wires have been formed by a "powder-in-tube" process in which a tube of cladding material is filled with the fine powder and the composite tube is then drawn to smaller diameter. (S. Jin et al, high Critical Currents in Iron-clad Superconducting MgB2 Wires, Nature, Vol. 410, 63(2001)). This process is expensive and may not lead to optimum properties in the fabricated wire.

Another approach to forming MgB2 wires has been to convert boron filaments by reaction with magnesium vapor. Boron filaments are formed in a continuous chemical vapor deposition (CVD) process; 100 micron diameter boron filaments on a 12 micron tungsten substrate are commercially available in lengths exceeding several kilometers. Segments of these filaments were reacted with magnesium vapor in sealed tantalum tubes. (Canfield et al, Superconductivity in Dense MgB2 Wires, Phys. Rev. Lett., Vol. 86, 2424 (2001)). The filament segments retained the shape of wires after conversion to MgB2, and exhibited good superconducting properties. However, the resulting wires were fragile and difficult to handle.

One objective of the invention disclosed below is to form a boron substrate which can be converted to magnesium diboride in continuous wire form while still retaining both good superconducting properties and good mechanical properties such as handleability.

Another aspect of the superconducting behavior of MgB2 is the effect of impurities. Impurity sites can enhance the current-carrying capability of a superconductor by "pinning" magnetic vortices; the restrained vortices allow the sample to retain a zero electrical resistance. (Canfield and Bud'ko, Physics World, 29, Jan. 2001.) Impurities which have been found useful for enhancing the properties of MgB2 include magnesium oxide, carbon, silicon carbide and titanium diboride.

Another objective of this invention is to provide a continuous boron substrate doped in a controlled manner by chemical vapor deposition with atomic species which will, upon conversion of the boron to MgB2, form "pinning" sites which will enhance the current-carrying capability of the resulting superconductor.

SUMMARY OF THE INVENTION

In this invention, chemically doped boron coatings are applied by chemical vapor deposition to silicon carbide fibers; these coated fibers are then exposed to magnesium vapor to convert the doped boron to doped magnesium diboride. The silicon carbide fibers are the commercially available SCS-9 or 9A (nominal 3 mil diameter) or SCS-6 (5.6 mil diameter). These silicon carbide fibers exhibit high mechanical properties with tensile strength typically in excess of 500 kpsi and Young's modulus in excess of 50 mpsi. The SCS fibers have a carbonaceous surface layer which enhances the use of the fibers in composite applications. Silicon carbide fibers can also be produced without a carbon-rich surface layer. The chemically doped boron coatings are produced by the controlled addition of a dopant vapor to the gas stream normally used to deposit boron. In this way the concentration of the dopant in the coating can be controlled. For example, addition of titanium tetrachloride vapor to the roughly stoichiometric hydrogen and boron trichloride mixture normally used to deposit boron will result in the deposition of boron doped with titanium diboride, and the concentration of the titanium diboride can be controlled through the vapor pressure of titanium tetrachloride. When the (B/TiB2)-coated SiC is then exposed to magnesium vapor at high temperature, the result is a robust SiC fiber coated with magnesium diboride doped with titanium diboride.

Another useful dopant for magnesium diboride is magnesium oxide. This can be produced by adding controller amounts of $B_3O_3Cl_3$ to the gas stream used for boron deposition. The oxygen-doped boron thus produced will convert to magnesium oxide-doped magnesium diboride upon processing as above.

Silicon carbide has been shown to be a useful dopant for magnesium diboride. The doped MgB2 was prepared in pellet form by the reaction of a mixture of boron, magnesium and silicon carbide powders in sealed tubes. Boron made by chemical vapor deposition (by the hydrogen reduction of boron trichloride) can be doped with controlled amounts of silicon carbide by the addition of metered amounts of an organosilane such as methyltrichlorosilane to the plating gas during the deposition process. Hence, a more convenient method of forming a continuous SiC-doped MgB2 wire is a process which includes forming a continuous SiC-doped boron substrate by chemical vapor deposition and subsequently converting the substrate to doped MgB2 by reaction with magnesium. The chemical vapor deposition process provides a means of fabricating a continuous substrate of controlled composition with a uniform dispersion of the dopant.

Similarly, carbon as a dopant can be incorporated into continuous MgB2 wires through a process as described above where a hydrocarbon is added to the plating gas during boron deposition instead of an organosilane.

Boron-containing coatings on silicon carbide are known (Suplinskas et al, U.S. Pat. No. 4,481,257) but their application is limited to enhancing the bonding in composites in which the silicon carbide provides the reinforcement. The application to the formation of superconducting wires is novel.

The doped boron coatings may be deposited on substrates other than silicon carbide fiber. Tungsten wires, molybdenum wires and carbon monofilament, for example, can be used for boron deposition and could be used as well for the deposition of doped boron. In this case, the specific mechanical property enhancement due to the use of silicon carbide would not result, but the improvement in superconducting properties such as superconducting critical current density and upper critical magnetic field would still be obtained after the coatings are reacted with magnesium to form magnesium diboride. The conversion to magnesium diboride has been illustrated by using the process of Caulfield et al, but other means of converting the doped boron to a superconductor are possible; for example, the continuous doped boron could be passed through a batch of molten magnesium. The method used for the reaction of the boron with magnesium is separate from the invention described here.

DESCRIPTION OF A SPECIFIC EMBODIMENT

EXAMPLE 1

SCS-9 fiber, 3 mils in diameter, was passed through a reactor normally used for the deposition of continuous boron fiber. The continuous silicon carbide fiber enters the reactor at the top through a mercury gas seal and electrode, and exits at the bottom of the reactor through a similar seal/electrode. Fiber emerging from the bottom of the reactor is taken up on a variable speed take-up reel. The rate of fiber traverse through the reactor was 20 feet per minute. Reactant gases are admitted at the top of the reactor and exhausted at the bottom. Metered flows of 3.1 liters per minute of hydrogen and 4.2 liters per minute of boron trichloride were passed through the reactor. The silicon carbide was resistively heated by an electric current produced between mercury gas seals/electrodes at the top and bottom of the reactor. At a current of 200 milliamps, the silicon carbide fiber was heated to 1100-1300 degrees Celsius. The hydrogen flow was then directed to pass through a bubbler (coarse glass frit) containing liquid titanium tetrachloride. The bubbler was immersed in an ice-water bath; a thermocouple immersed in the TiCl4 read 3% C. The hydrogen/titanium tetrachloride mixture emerging from the bubbler was then mixed with the boron trichloride and passed through the reactor. The diameter of the fiber emerging from the reactor was approximately 3.3 mils compared to the 3 mil SCS-9 entering the reactor. A sample of this coated fiber was collected on the take up spool.

Examination of the collected sample showed a smooth uniform adherent coating approximately 4 microns thick. Auger analysis of the coating showed it to consist of approximately 90% boron and 10% titanium. Sections of this fiber were sealed in tantalum tubes with magnesium and heated to 950% C for one hour in the laboratory of Doug Finnemore at Iowa State University by the method described by Caulfield et al (loc.cit.). These converted fibers were superconducting with a transition temperature of about 39% K. Subsequent measurements showed a critical current density of 5 million amps per square centimeter at 5% K and a magnetic field of 0.1 Tesla. Similar measurements on superconductors made from pure boron gave maximum values of approximately 600,000 amps per square centimeter. The wires thus produced were handleable and could be bent around a half inch diameter without breaking.

EXAMPLE 2

Silicon carbide fiber, 3 mils in diameter, was passed through the reactor described above. The rate of fiber traverse through the reactor was 20 feet per minute. Metered flows of 3.1 liters per minute of hydrogen and 4.2 liters per minute of boron trichloride vapor were passed through the reactor. The silicon carbide fiber was resistively heated to approximately 1100 degrees C. by a current of 162 milliamps. A portion of the hydrogen flow could be diverted through a bubbler (coarse glass frit) containing liquid methyltrichlorosilane at a temperature of 27-34 degrees C. In a series of experiments as described in the table below, the percentage of the total hydrogen flow that was diverted to the bubbler was varied systematically. In all cases, smooth adherent coatings 2-4 microns thick were formed on the silicon carbide. The composition of the coatings was determined by Energy Dispersive X-ray Analysis on a scanning electron microscope. The atomic percent silicon found in each case is noted in the table. The data demonstrates that controlled doping of the boron coatings was accomplished.

| Experiment Number | % Flow through Bubbler | Atomic % Silicon |
| --- | --- | --- |
| 1 | 0 | 0 |
| 2 | 18 | 1.5 |
| 3 | 36 | 5.0 |
| 4 | 55 | 6.3 |
| 5 | 73 | 8.1 |

EXAMPLE 3

Silicon carbide fiber, 3 mils in diameter, was passed through the reactor described above. The rate of fiber traverse through the reactor was 20 feet per minute. Metered flows of 3.1 liters per minute of hydrogen and 4.2 liters per minute of boron trichloride vapor were passed through the reactor. The silicon carbide fiber was resistively heated by the passage of electrical current in the range 162-178 milliamps as indicated in the table below. A metered flow of methane gas in the range of 0-950 standard cubic centimeters per minute (SCCM) could be added to the reactor in addition to the hydrogen and boron trichloride. A series of experiments was performed in which the current and methane flow were varied as described in the table. In all cases, smooth adherent coatings 2-4 microns thick were formed on the silicon carbide. The composition of the coatings was determined by Energy Dispersive X-ray Analysis on a scanning electron microscope. The atomic percent carbon found in each case is noted in the table. The data demonstrates that controlled doping of the boron coatings was accomplished.

| Sample Number | Methane (SCCM) | Current (ma) | Atomic % Carbon |
| --- | --- | --- | --- |
| 1 | 0 | 165 | 0 |
| 2 | 250 | 162 | 1.5 |
| 4 | 500 | 170 | 3.3 |
| 6 | 950 | 178 | 6.3 |

DOCUMENTATION

These experiments are described in detail in my laboratory notebook entitled "B for superconductors" on pages 3-114.

The invention claimed is:

1. A method for producing doped magnesium diboride comprising the steps of:
    introducing a boron containing vapor into a reaction vessel;
    introducing a titanium tetrachloride dopant vapor into the vessel to provide a mixture of the dopant vapor and the boron containing vapor;
    heating the mixture to produce doped boron; and
    exposing the doped boron to magnesium vapor to convert the doped boron to doped magnesium diboride.

2. The method of claim 1 wherein the boron containing vapor is a hydrogen and boron trichloride vapor mixture.

3. The method of claim 2 wherein hydrogen and boron trichloride vapor mixture is an approximately stoichiometric mixture.

4. A superconductor comprising doped magnesium diboride formed by heating a mixture of a boron containing vapor and a titanium tetrachloride dopant vapor to produce doped boron and exposing the doped boron to a magnesium vapor.

5. A superconductor according to claim 4 wherein the boron containing vapor is a hydrogen and boron trichloride vapor mixture.

6. A superconductor according to claim 5 wherein the hydrogen and boron trichloride vapor mixture is an approximately stoichiometric mixture.

7. A superconductor according to claim 4 wherein the doped boron is a coating on a fiber substrate.

8. A superconductor according to claim 7 wherein the boron containing vapor is a hydrogen and boron trichloride vapor mixture.

9. A superconductor according to claim 7 wherein the fiber substrate is a silicon carbide substrate.

10. A superconductor according to claim 9 wherein the boron containing vapor is a hydrogen and boron trichloride vapor mixture.

\* \* \* \* \*

UNITED STATES PATENT AND TRADEMARK OFFICE
CERTIFICATE OF CORRECTION

| | | |
|---|---|---|
| PATENT NO. | : 7,294,606 B2 | Page 1 of 1 |
| APPLICATION NO. | : 10/989803 | |
| DATED | : November 13, 2007 | |
| INVENTOR(S) | : Suplinskas et al. | |

It is certified that error appears in the above-identified patent and that said Letters Patent is hereby corrected as shown below:

In the Title section (54) and col. 1, line 4, please delete "WIRE", and insert --WIRES--.

Signed and Sealed this

Seventh Day of October, 2008

JON W. DUDAS
*Director of the United States Patent and Trademark Office*